(12) United States Patent
Schouhamer Immink (10) Patent No.: US 6,768,432 B2
(45) Date of Patent: Jul. 27, 2004

(54) METHOD OF CONVERTING A SERIES OF M-BIT INFORMATION WORDS INTO A MODULATED SIGNAL

(75) Inventor: Kornelis Antonie Schouhamer Immink, Geldrop (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 98 days.

(21) Appl. No.: 10/239,270

(22) PCT Filed: Jan. 29, 2002

(86) PCT No.: PCT/EP01/01151

§ 371 (c)(1),
(2), (4) Date: Sep. 20, 2002

(87) PCT Pub. No.: WO02/063774

PCT Pub. Date: Aug. 15, 2002

(65) Prior Publication Data

US 2003/0141996 A1 Jul. 31, 2003

(51) Int. Cl.$^7$ .............................. H03M 7/20; H03M 7/00
(52) U.S. Cl. .......................................... 341/102; 341/59
(58) Field of Search ........................... 341/102, 58, 59, 341/68, 81; 375/292, 240, 259, 242; 369/59.26; 360/40

(56) References Cited

U.S. PATENT DOCUMENTS

| | | | | |
|---|---|---|---|---|
| 4,539,691 A | * | 9/1985 | Ogawa et al. | 375/259 |
| 4,731,678 A | * | 3/1988 | Takeuchi | 360/40 |
| 4,988,999 A | * | 1/1991 | Uehara et al. | 341/59 |
| 5,077,721 A | * | 12/1991 | Sako et al. | 369/59.26 |
| 5,774,078 A | * | 6/1998 | Tanaka et al. | 341/68 |
| 6,268,810 B1 | * | 7/2001 | Shim et al. | 341/59 |
| 6,351,501 B1 | * | 2/2002 | Murdock | 375/292 |

FOREIGN PATENT DOCUMENTS

EP 655850 * 5/1995

* cited by examiner

Primary Examiner—Patrick Wamsley
(74) Attorney, Agent, or Firm—Russell Gross (57) ABSTRACT

This invention relates to a digital modulation method and apparatus used for recording an audio or video signal, computer data, and etc on a recording medium such as an optical or magneto-optical disc. Data words of m bits are translated into code words of n bits in accordance with a conversion table. The code words satisfy a (d, k) constraint in which at least d "0"s and not more than k "0"s occur between consecutive "1"s. The n-bit code words alternate with p-bit merging words which are selected such that between the leading "1" in the code word following the merging word and the trailing "1" in the merging word are at least d "0"s, and further that between the trailing "1" in the code word preceding the merging word and the leading "1" in the merging word are at least d "0"s. The merging word that satisfies said conditions, yielding the lowest dc imbalance of the modulated signal obtained after modulo-2 integration of the catenation of the alternate code words and merging words is selected. Then, the modulated signal is generated by the catenation of alternate code words and merging words integrated modulo-2 in which a "1" becomes a transition and a "0" becomes an absence of a transition. A unique synchronizing word is inserted periodically.

9 Claims, 10 Drawing Sheets

| | DATA BITS | CHANNEL BITS |
| --- | --- | --- |
| | d1 d2 d3 d4 d5 d6 d7 d8 | c1 c2 c3 c4 c5 c6 c7 c8 c9 c10 c11 c12 c13 c14 |
| 0 | 0 0 0 0 0 0 0 0 | 0 1 0 0 1 0 0 0 1 0 0 0 0 0 |
| 1 | 0 0 0 0 0 0 0 1 | 1 0 0 0 0 1 0 0 0 0 0 0 0 0 |
| 2 | 0 0 0 0 0 0 1 0 | 1 0 0 1 0 0 0 0 1 0 0 0 0 0 |
| 3 | 0 0 0 0 0 0 1 1 | 1 0 0 0 1 0 0 0 1 0 0 0 0 0 |
| 4 | 0 0 0 0 0 1 0 0 | 0 1 0 0 0 1 0 0 0 0 0 0 0 0 |
| 5 | 0 0 0 0 0 1 0 1 | 0 0 0 0 0 1 0 0 0 1 0 0 0 0 |
| 6 | 0 0 0 0 0 1 1 0 | 0 0 0 1 0 0 0 1 0 0 0 0 0 0 |
| 7 | 0 0 0 0 0 1 1 1 | 0 0 1 0 0 1 0 0 0 0 0 0 0 0 |
| 8 | 0 0 0 0 1 0 0 0 | 0 1 0 0 1 0 0 1 0 0 0 0 0 0 |
| 9 | 0 0 0 0 1 0 0 1 | 1 0 0 0 0 0 1 0 0 0 0 0 0 0 |
| 10 | 0 0 0 0 1 0 1 0 | 1 0 0 1 0 0 0 1 0 0 0 0 0 0 |
| 11 | 0 0 0 0 1 0 1 1 | 1 0 0 0 1 0 0 1 0 0 0 0 0 0 |
| 12 | 0 0 0 0 1 1 0 0 | 0 1 0 0 0 0 1 0 0 0 0 0 0 0 |
| 13 | 0 0 0 0 1 1 0 1 | 0 0 0 0 0 0 1 0 0 0 0 0 0 0 |
| 14 | 0 0 0 0 1 1 1 0 | 0 0 0 1 0 0 1 0 0 0 0 0 0 0 |
| 15 | 0 0 0 0 1 1 1 1 | 0 0 1 0 0 0 1 0 0 0 0 0 0 0 |
| 16 | 0 0 0 1 0 0 0 0 | 1 0 0 0 0 0 0 1 0 0 0 0 0 0 |
| 17 | 0 0 0 1 0 0 0 1 | 1 0 0 0 0 1 0 0 0 0 0 0 0 0 |
| 18 | 0 0 0 1 0 0 1 0 | 1 0 0 1 0 0 1 0 0 0 0 0 0 0 |
| 19 | 0 0 0 1 0 0 1 1 | 0 0 1 0 0 0 0 1 0 0 0 0 0 0 |
| 20 | 0 0 0 1 0 1 0 0 | 0 1 0 0 0 0 1 0 0 0 0 0 0 0 |
| 21 | 0 0 0 1 0 1 0 1 | 0 0 0 0 0 0 1 0 0 0 0 0 0 0 |
| 22 | 0 0 0 1 0 1 1 0 | 0 0 0 1 0 0 1 0 0 0 0 0 0 0 |
| 23 | 0 0 0 1 0 1 1 1 | 0 0 1 0 0 1 0 0 0 0 0 0 0 0 |
| 24 | 0 0 0 1 1 0 0 0 | 0 1 0 0 1 0 0 0 1 0 0 0 0 0 |
| 25 | 0 0 0 1 1 0 0 1 | 1 0 0 0 0 0 0 0 1 0 0 0 0 0 |
| 26 | 0 0 0 1 1 0 1 0 | 1 0 0 1 0 0 0 0 1 0 0 0 0 0 |
| 27 | 0 0 0 1 1 0 1 1 | 1 0 0 0 1 0 0 0 1 0 0 0 0 0 |
| 28 | 0 0 0 1 1 1 0 0 | 0 1 0 0 0 0 0 0 1 0 0 0 0 0 |
| 29 | 0 0 0 1 1 1 0 1 | 0 0 0 0 1 0 0 0 1 0 0 0 0 0 |
| 30 | 0 0 0 1 1 1 1 0 | 0 0 0 1 0 0 0 0 1 0 0 0 0 0 |
| 31 | 0 0 0 1 1 1 1 1 | 0 0 1 0 0 0 0 0 1 0 0 0 0 0 |

FIG. 4A

|    | DATA BITS | CHANNEL BITS |
|----|-----------|--------------|
|    | d1 d2 d3 d4 d5 d6 d7 d8 | c1 c2 c3 c4 c5 c6 c7 c8 c9 c10 c11 c12 c13 c14 |
| 32 | 0 0 1 0 0 0 0 0 | 0 0 0 0 0 0 0 1 0 0 0 0 0 0 |
| 33 | 0 0 1 0 0 0 0 1 | 1 0 0 0 0 1 0 0 0 1 0 0 0 0 |
| 34 | 0 0 1 0 0 0 1 0 | 0 0 0 0 1 0 0 1 0 0 0 0 0 0 |
| 35 | 0 0 1 0 0 0 1 1 | 0 0 1 0 0 1 0 0 1 0 0 0 0 0 |
| 36 | 0 0 1 0 0 1 0 0 | 0 1 0 0 0 1 0 0 0 0 1 0 0 0 |
| 37 | 0 0 1 0 0 1 0 1 | 0 0 0 0 0 1 0 0 0 0 1 0 0 0 |
| 38 | 0 0 1 0 0 1 1 0 | 0 1 0 0 0 0 0 1 0 0 0 0 0 0 |
| 39 | 0 0 1 0 0 1 1 1 | 0 1 0 0 1 0 0 0 0 1 0 0 0 0 |
| 40 | 0 0 1 0 1 0 0 0 | 0 1 0 0 1 0 0 1 0 0 1 0 0 0 |
| 41 | 0 0 1 0 1 0 0 1 | 1 0 0 0 0 0 1 0 0 1 0 0 0 0 |
| 42 | 0 0 1 0 1 0 1 0 | 1 0 0 1 0 0 0 1 0 0 1 0 0 0 |
| 43 | 0 0 1 0 1 0 1 1 | 1 0 0 0 1 0 0 1 0 0 1 0 0 0 |
| 44 | 0 0 1 0 1 1 0 0 | 0 1 0 0 0 0 0 1 0 0 1 0 0 0 |
| 45 | 0 0 1 0 1 1 0 1 | 0 0 0 0 0 0 0 1 0 0 1 0 0 0 |
| 46 | 0 0 1 0 1 1 1 0 | 0 0 0 1 0 0 0 1 0 0 1 0 0 0 |
| 47 | 0 0 1 0 1 1 1 1 | 0 0 1 0 0 0 0 1 0 0 1 0 0 0 |
| 48 | 0 0 1 1 0 0 0 0 | 0 0 0 0 0 1 0 0 0 0 0 0 0 0 |
| 49 | 0 0 1 1 0 0 0 1 | 1 0 0 0 0 0 1 0 0 0 1 0 0 0 |
| 50 | 0 0 1 1 0 0 1 0 | 1 0 0 1 0 0 1 0 0 0 1 0 0 0 |
| 51 | 0 0 1 1 0 0 1 1 | 1 0 0 0 0 1 0 0 0 1 0 0 0 0 |
| 52 | 0 0 1 1 0 1 0 0 | 0 1 0 0 0 0 1 0 0 0 1 0 0 0 |
| 53 | 0 0 1 1 0 1 0 1 | 0 0 0 0 0 0 1 0 0 0 1 0 0 0 |
| 54 | 0 0 1 1 0 1 1 0 | 0 0 0 1 0 0 1 0 0 0 1 0 0 0 |
| 55 | 0 0 1 1 0 1 1 1 | 0 0 1 0 0 1 0 0 0 1 0 0 0 0 |
| 56 | 0 0 1 1 1 0 0 0 | 0 1 0 0 1 0 0 0 0 1 0 0 0 0 |
| 57 | 0 0 1 1 1 0 0 1 | 1 0 0 0 0 0 0 0 0 1 0 0 0 0 |
| 58 | 0 0 1 1 1 0 1 0 | 1 0 0 1 0 0 0 0 0 1 0 0 0 0 |
| 59 | 0 0 1 1 1 0 1 1 | 1 0 0 0 1 0 0 0 0 1 0 0 0 0 |
| 60 | 0 0 1 1 1 1 0 0 | 0 1 0 0 0 0 0 0 0 1 0 0 0 0 |
| 61 | 0 0 1 1 1 1 0 1 | 0 0 0 1 0 0 0 0 0 1 0 0 0 0 |
| 62 | 0 0 1 1 1 1 1 0 | 0 0 0 1 0 0 0 0 0 1 0 0 0 0 |
| 63 | 0 0 1 1 1 1 1 1 | 0 0 1 0 0 0 0 0 0 1 0 0 0 0 |

FIG. 4B

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 |
| 64 | 0 1 0 0 0 0 0 0 | 0 1 0 0 1 0 0 0 1 0 0 1 0 0 |
| 65 | 0 1 0 0 0 0 0 1 | 1 0 0 0 0 1 0 0 1 0 0 1 0 0 |
| 66 | 0 1 0 0 0 0 1 0 | 1 0 0 1 0 0 0 0 1 0 0 1 0 0 |
| 67 | 0 1 0 0 0 0 1 1 | 1 0 0 0 1 0 0 0 1 0 0 1 0 0 |
| 68 | 0 1 0 0 0 1 0 0 | 0 1 0 0 0 1 0 0 1 0 0 1 0 0 |
| 69 | 0 1 0 0 0 1 0 1 | 0 0 0 0 0 0 0 1 0 0 1 0 0 |
| 70 | 0 1 0 0 0 1 1 0 | 0 0 0 1 0 0 0 0 1 0 0 1 0 0 |
| 71 | 0 1 0 0 0 1 1 1 | 0 0 1 0 0 1 0 0 1 0 0 1 0 0 |
| 72 | 0 1 0 0 1 0 0 0 | 0 1 0 0 1 0 0 1 0 0 0 1 0 0 |
| 73 | 0 1 0 0 1 0 0 1 | 1 0 0 0 0 0 0 1 0 0 0 1 0 0 |
| 74 | 0 1 0 0 1 0 1 0 | 1 0 0 1 0 0 0 1 0 0 0 1 0 0 |
| 75 | 0 1 0 0 1 0 1 1 | 1 0 0 0 1 0 0 1 0 0 0 1 0 0 |
| 76 | 0 1 0 0 1 1 0 0 | 0 1 0 0 0 0 0 1 0 0 0 1 0 0 |
| 77 | 0 1 0 0 1 1 0 1 | 0 0 0 0 0 0 0 1 0 0 0 1 0 0 |
| 78 | 0 1 0 0 1 1 1 0 | 0 0 0 1 0 0 0 1 0 0 0 1 0 0 |
| 79 | 0 1 0 0 1 1 1 1 | 0 0 1 0 0 0 0 1 0 0 0 1 0 0 |
| 80 | 0 1 0 1 0 0 0 0 | 1 0 0 0 0 0 0 0 1 0 0 1 0 0 |
| 81 | 0 1 0 1 0 0 0 1 | 1 0 0 0 0 0 1 0 0 0 0 1 0 0 |
| 82 | 0 1 0 1 0 0 1 0 | 1 0 0 1 0 0 1 0 0 0 0 1 0 0 |
| 83 | 0 1 0 1 0 0 1 1 | 0 0 1 0 0 0 0 1 0 0 0 1 0 0 |
| 84 | 0 1 0 1 0 1 0 0 | 0 1 0 0 0 1 0 0 0 0 0 1 0 0 |
| 85 | 0 1 0 1 0 1 0 1 | 0 0 0 0 0 1 0 0 0 0 1 0 0 |
| 86 | 0 1 0 1 0 1 1 0 | 0 0 0 1 0 0 1 0 0 0 0 1 0 0 |
| 87 | 0 1 0 1 0 1 1 1 | 0 0 1 0 0 0 1 0 0 0 0 1 0 0 |
| 88 | 0 1 0 1 1 0 0 0 | 0 1 0 0 1 0 0 0 0 0 0 1 0 0 |
| 89 | 0 1 0 1 1 0 0 1 | 1 0 0 0 0 0 0 0 0 0 0 1 0 0 |
| 90 | 0 1 0 1 1 0 1 0 | 1 0 0 1 0 0 0 0 0 0 0 1 0 0 |
| 91 | 0 1 0 1 1 0 1 1 | 1 0 0 0 1 0 0 0 0 0 0 1 0 0 |
| 92 | 0 1 0 1 1 1 0 0 | 0 1 0 0 0 0 0 0 0 0 0 1 0 0 |
| 93 | 0 1 0 1 1 1 0 1 | 0 0 0 0 1 0 0 0 0 0 0 1 0 0 |
| 94 | 0 1 0 1 1 1 1 0 | 0 0 0 1 0 0 0 0 0 0 0 1 0 0 |
| 95 | 0 1 0 1 1 1 1 1 | 0 0 1 0 0 0 0 0 0 0 0 1 0 0 |

FIG. 4C

| | DATA BITS | CHANNEL BITS |
| --- | --- | --- |
| | d1 d2 d3 d4 d5 d6 d7 d8 | c1 c2 c3 c4 c5 c6 c7 c8 c9 c10 c11 c12 c13 c14 |
| 96 | 0 1 1 0 0 0 0 0 | 0 1 0 0 1 0 0 0 1 0 0 0 1 0 |
| 97 | 0 1 1 0 0 0 0 1 | 1 0 0 0 0 1 0 0 1 0 0 0 1 0 |
| 98 | 0 1 1 0 0 0 1 0 | 1 0 0 1 0 0 0 0 1 0 0 0 1 0 |
| 99 | 0 1 1 0 0 0 1 1 | 1 0 0 0 1 0 0 0 1 0 0 0 1 0 |
| 100 | 0 1 1 0 0 1 0 0 | 0 1 0 0 0 1 0 0 1 0 0 0 1 0 |
| 101 | 0 1 1 0 0 1 0 1 | 0 0 0 0 0 0 0 0 1 0 0 0 1 0 |
| 102 | 0 1 1 0 0 1 1 0 | 0 1 0 0 0 0 0 1 0 0 1 0 0 |
| 103 | 0 1 1 0 0 1 1 1 | 0 0 1 0 0 1 0 0 1 0 0 0 1 0 |
| 104 | 0 1 1 0 1 0 0 0 | 0 1 0 0 1 0 0 1 0 0 0 0 1 0 |
| 105 | 0 1 1 0 1 0 0 1 | 1 0 0 0 0 0 0 1 0 0 0 0 1 0 |
| 106 | 0 1 1 0 1 0 1 0 | 1 0 0 1 0 0 0 1 0 0 0 0 1 0 |
| 107 | 0 1 1 0 1 0 1 1 | 1 0 0 0 1 0 0 1 0 0 0 0 1 0 |
| 108 | 0 1 1 0 1 1 0 0 | 0 1 0 0 0 0 0 1 0 0 0 0 1 0 |
| 109 | 0 1 1 0 1 1 0 1 | 0 0 0 0 0 0 0 1 0 0 0 0 1 0 |
| 110 | 0 1 1 0 1 1 1 0 | 0 0 0 1 0 0 0 1 0 0 0 0 1 0 |
| 111 | 0 1 1 0 1 1 1 1 | 0 0 1 0 0 0 0 1 0 0 0 0 1 0 |
| 112 | 0 1 1 1 0 0 0 0 | 1 0 0 0 0 0 0 0 1 0 0 0 1 0 |
| 113 | 0 1 1 1 0 0 0 1 | 1 0 0 0 0 1 0 0 0 0 0 0 1 0 |
| 114 | 0 1 1 1 0 0 1 0 | 1 0 0 1 0 0 1 0 0 0 0 0 1 0 |
| 115 | 0 1 1 1 0 0 1 1 | 0 0 1 0 0 0 0 1 0 0 0 0 1 0 |
| 116 | 0 1 1 1 0 1 0 0 | 0 1 0 0 0 1 0 0 0 0 0 0 1 0 |
| 117 | 0 1 1 1 0 1 0 1 | 0 0 0 0 0 1 0 0 0 0 0 0 1 0 |
| 118 | 0 1 1 1 0 1 1 0 | 0 0 0 1 0 0 1 0 0 0 0 0 1 0 |
| 119 | 0 1 1 1 0 1 1 1 | 0 0 1 0 0 1 0 0 0 0 0 0 1 0 |
| 120 | 0 1 1 1 1 0 0 0 | 0 1 0 0 1 0 0 0 0 0 0 0 1 0 |
| 121 | 0 1 1 1 1 0 0 1 | 0 0 0 0 1 0 0 1 0 0 1 0 0 0 |
| 122 | 0 1 1 1 1 0 1 0 | 1 0 0 1 0 0 0 0 0 0 0 0 1 0 |
| 123 | 0 1 1 1 1 0 1 1 | 1 0 0 0 1 0 0 0 0 0 0 0 1 0 |
| 124 | 0 1 1 1 1 1 0 0 | 0 1 0 0 0 0 0 0 0 0 0 0 1 0 |
| 125 | 0 1 1 1 1 1 0 1 | 0 0 0 0 1 0 0 0 0 0 0 0 1 0 |
| 126 | 0 1 1 1 1 1 1 0 | 0 0 0 1 0 0 0 0 0 0 0 0 1 0 |
| 127 | 0 1 1 1 1 1 1 1 | 0 0 1 0 0 0 0 0 0 0 0 0 1 0 |

FIG. 4D

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 |
| 128 | 1 0 0 0 0 0 0 0 | 0 1 0 0 1 0 0 0 1 0 0 0 0 1 |
| 129 | 1 0 0 0 0 0 0 1 | 1 0 0 0 0 1 0 0 1 0 0 0 0 1 |
| 130 | 1 0 0 0 0 0 1 0 | 1 0 0 1 0 0 0 0 1 0 0 0 0 1 |
| 131 | 1 0 0 0 0 0 1 1 | 1 0 0 0 1 0 0 0 1 0 0 0 0 1 |
| 132 | 1 0 0 0 0 1 0 0 | 0 1 0 0 0 1 0 0 1 0 0 0 0 1 |
| 133 | 1 0 0 0 0 1 0 1 | 0 0 0 0 0 0 0 0 1 0 0 0 0 1 |
| 134 | 1 0 0 0 0 1 1 0 | 0 0 0 1 0 0 0 0 1 0 0 0 0 1 |
| 135 | 1 0 0 0 0 1 1 1 | 0 0 1 0 0 1 0 0 1 0 0 0 0 1 |
| 136 | 1 0 0 0 1 0 0 0 | 0 1 0 0 1 0 0 1 0 0 0 0 0 1 |
| 137 | 1 0 0 0 1 0 0 1 | 1 0 0 0 0 0 0 1 0 0 0 0 0 1 |
| 138 | 1 0 0 0 1 0 1 0 | 1 0 0 1 0 0 0 1 0 0 0 0 0 1 |
| 139 | 1 0 0 0 1 0 1 1 | 1 0 0 0 1 0 0 1 0 0 0 0 0 1 |
| 140 | 1 0 0 0 1 1 0 0 | 0 1 0 0 0 0 0 1 0 0 0 0 0 1 |
| 141 | 1 0 0 0 1 1 0 1 | 0 0 0 0 0 0 0 1 0 0 0 0 0 1 |
| 142 | 1 0 0 0 1 1 1 0 | 0 0 0 1 0 0 0 1 0 0 0 0 0 1 |
| 143 | 1 0 0 0 1 1 1 1 | 0 0 1 0 0 0 0 1 0 0 0 0 0 1 |
| 144 | 1 0 0 1 0 0 0 0 | 1 0 0 0 0 0 0 0 1 0 0 0 0 1 |
| 145 | 1 0 0 1 0 0 0 1 | 1 0 0 0 0 0 1 0 0 0 0 0 0 1 |
| 146 | 1 0 0 1 0 0 1 0 | 1 0 0 1 0 0 1 0 0 0 0 0 0 1 |
| 147 | 1 0 0 1 0 0 1 1 | 0 0 1 0 0 0 0 0 1 0 0 0 0 1 |
| 148 | 1 0 0 1 0 1 0 0 | 0 1 0 0 0 0 1 0 0 0 0 0 0 1 |
| 149 | 1 0 0 1 0 1 0 1 | 0 0 0 0 0 0 1 0 0 0 0 0 0 1 |
| 150 | 1 0 0 1 0 1 1 0 | 0 0 0 1 0 0 1 0 0 0 0 0 0 1 |
| 151 | 1 0 0 1 0 1 1 1 | 0 0 1 0 0 1 0 0 0 0 0 0 0 1 |
| 152 | 1 0 0 1 1 0 0 0 | 0 1 0 0 1 0 0 0 0 0 0 0 0 1 |
| 153 | 1 0 0 1 1 0 0 1 | 1 0 0 0 0 1 0 0 1 0 0 0 0 0 |
| 154 | 1 0 0 1 1 0 1 0 | 1 0 0 1 0 0 0 0 0 0 0 0 0 1 |
| 155 | 1 0 0 1 1 0 1 1 | 1 0 0 0 1 0 0 0 0 0 0 0 0 1 |
| 156 | 1 0 0 1 1 1 0 0 | 0 1 0 0 0 0 1 0 0 1 0 0 0 0 |
| 157 | 1 0 0 1 1 1 0 1 | 0 0 0 0 1 0 0 0 0 0 0 0 0 1 |
| 158 | 1 0 0 1 1 1 1 0 | 0 0 0 1 0 0 0 0 0 0 0 0 0 1 |
| 159 | 1 0 0 1 1 1 1 1 | 0 0 1 0 0 0 1 0 0 1 0 0 0 0 |

FIG. 4E

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 |
| 160 | 1 0 1 0 0 0 0 0 | 0 0 0 0 1 0 0 0 1 0 0 0 0 1 |
| 161 | 1 0 1 0 0 0 0 1 | 1 0 0 0 0 1 0 0 0 0 1 0 0 1 |
| 162 | 1 0 1 0 0 0 1 0 | 0 1 0 0 0 1 0 0 0 1 0 0 0 0 |
| 163 | 1 0 1 0 0 0 1 1 | 0 0 0 0 0 1 0 0 1 0 0 0 0 1 |
| 164 | 1 0 1 0 0 1 0 0 | 0 1 0 0 0 1 0 0 0 0 0 1 0 1 |
| 165 | 1 0 1 0 0 1 0 1 | 0 0 0 0 0 1 0 0 0 0 1 0 0 1 |
| 166 | 1 0 1 0 0 1 1 0 | 0 1 0 0 0 0 0 0 1 0 0 0 0 1 |
| 167 | 1 0 1 0 0 1 1 1 | 0 0 1 0 0 1 0 0 0 0 1 0 0 1 |
| 168 | 1 0 1 0 1 0 0 0 | 0 1 0 0 1 0 0 1 0 0 1 0 0 1 |
| 169 | 1 0 1 0 1 0 0 1 | 1 0 0 0 0 0 1 0 0 1 0 0 0 1 |
| 170 | 1 0 1 0 1 0 1 0 | 1 0 0 1 0 0 0 1 0 0 1 0 0 1 |
| 171 | 1 0 1 0 1 0 1 1 | 1 0 0 0 1 0 0 1 0 0 1 0 0 1 |
| 172 | 1 0 1 0 1 1 0 0 | 0 1 0 0 0 0 0 1 0 0 1 0 0 1 |
| 173 | 1 0 1 0 1 1 0 1 | 0 0 0 0 0 0 0 1 0 0 1 0 0 1 |
| 174 | 1 0 1 0 1 1 1 0 | 0 0 0 1 0 0 0 1 0 0 1 0 0 1 |
| 175 | 1 0 1 0 1 1 1 1 | 0 0 1 0 0 0 0 1 0 0 1 0 0 1 |
| 176 | 1 0 1 1 0 0 0 0 | 0 0 0 0 0 1 0 0 1 0 0 0 0 0 |
| 177 | 1 0 1 1 0 0 0 1 | 1 0 0 0 0 0 1 0 0 0 1 0 0 1 |
| 178 | 1 0 1 1 0 0 1 0 | 1 0 0 1 0 0 1 0 0 0 1 0 0 1 |
| 179 | 1 0 1 1 0 0 1 1 | 0 0 1 0 0 1 0 0 0 1 0 0 0 0 |
| 180 | 1 0 1 1 0 1 0 0 | 0 1 0 0 0 0 1 0 0 0 1 0 0 1 |
| 181 | 1 0 1 1 0 1 0 1 | 0 0 0 0 0 0 1 0 0 0 1 0 0 1 |
| 182 | 1 0 1 1 0 1 1 0 | 0 0 0 1 0 0 1 0 0 0 1 0 0 1 |
| 183 | 1 0 1 1 0 1 1 1 | 0 0 1 0 0 0 1 0 0 0 1 0 0 1 |
| 184 | 1 0 1 1 1 0 0 0 | 0 1 0 0 1 0 0 0 0 0 1 0 0 1 |
| 185 | 1 0 1 1 1 0 0 1 | 1 0 0 0 0 0 0 0 0 0 1 0 0 1 |
| 186 | 1 0 1 1 1 0 1 0 | 1 0 0 1 0 0 0 0 0 0 1 0 0 1 |
| 187 | 1 0 1 1 1 0 1 1 | 1 0 0 0 1 0 0 0 0 0 1 0 0 1 |
| 188 | 1 0 1 1 1 1 0 0 | 0 1 0 0 0 0 0 0 0 0 1 0 0 1 |
| 189 | 1 0 1 1 1 1 0 1 | 0 0 0 0 1 0 0 0 0 0 1 0 0 1 |
| 190 | 1 0 1 1 1 1 1 0 | 0 0 0 1 0 0 0 0 0 0 1 0 0 1 |
| 191 | 1 0 1 1 1 1 1 1 | 0 0 1 0 0 0 0 0 0 0 1 0 0 1 |

FIG. 4F

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 |
| 192 | 1 1 0 0 0 0 0 0 | 0 1 0 0 0 1 0 0 1 0 0 0 0 0 |
| 193 | 1 1 0 0 0 0 0 1 | 1 0 0 0 0 1 0 0 0 1 0 0 0 1 |
| 194 | 1 1 0 0 0 0 1 0 | 1 0 0 1 0 0 1 0 0 1 0 0 0 0 |
| 195 | 1 1 0 0 0 0 1 1 | 0 0 0 0 1 0 0 0 1 0 0 1 0 0 |
| 196 | 1 1 0 0 0 1 0 0 | 0 1 0 0 0 1 0 0 0 1 0 0 0 1 |
| 197 | 1 1 0 0 0 1 0 1 | 0 0 0 0 0 1 0 0 0 1 0 0 0 1 |
| 198 | 1 1 0 0 0 1 1 0 | 0 0 0 1 0 0 1 0 0 1 0 0 0 0 |
| 199 | 1 1 0 0 0 1 1 1 | 0 0 1 0 0 1 0 0 0 1 0 0 0 1 |
| 200 | 1 1 0 0 1 0 0 0 | 0 0 0 0 1 0 0 1 0 0 0 0 0 1 |
| 201 | 1 1 0 0 1 0 0 1 | 1 0 0 0 0 1 0 0 0 0 0 0 0 1 |
| 202 | 1 1 0 0 1 0 1 0 | 0 0 0 0 1 0 0 1 0 0 0 1 0 0 |
| 203 | 1 1 0 0 1 0 1 1 | 0 0 0 0 1 0 0 1 0 0 0 0 0 0 |
| 204 | 1 1 0 0 1 1 0 0 | 0 1 0 0 0 1 0 0 0 0 0 0 0 1 |
| 205 | 1 1 0 0 1 1 0 1 | 0 0 0 0 0 1 0 0 0 0 0 0 0 1 |
| 206 | 1 1 0 0 1 1 1 0 | 0 0 0 0 0 1 0 0 1 0 0 0 0 0 |
| 207 | 1 1 0 0 1 1 1 1 | 0 0 1 0 0 1 0 0 0 0 0 0 0 1 |
| 208 | 1 1 0 1 0 0 0 0 | 0 0 0 0 0 1 0 0 1 0 0 1 0 0 |
| 209 | 1 1 0 1 0 0 0 1 | 1 0 0 0 0 0 1 0 0 1 0 0 0 1 |
| 210 | 1 1 0 1 0 0 1 0 | 1 0 0 1 0 0 1 0 0 1 0 0 0 1 |
| 211 | 1 1 0 1 0 0 1 1 | 1 0 0 0 0 1 0 0 1 0 0 0 0 0 |
| 212 | 1 1 0 1 0 1 0 0 | 0 1 0 0 0 0 1 0 0 1 0 0 0 1 |
| 213 | 1 1 0 1 0 1 0 1 | 0 0 0 0 0 0 1 0 0 1 0 0 0 1 |
| 214 | 1 1 0 1 0 1 1 0 | 0 0 0 1 0 0 1 0 0 1 0 0 0 1 |
| 215 | 1 1 0 1 0 1 1 1 | 0 0 1 0 0 0 1 0 0 1 0 0 0 1 |
| 216 | 1 1 0 1 1 0 0 0 | 0 1 0 0 1 0 0 0 1 0 0 0 0 1 |
| 217 | 1 1 0 1 1 0 0 1 | 1 0 0 0 0 0 0 0 1 0 0 0 0 1 |
| 218 | 1 1 0 1 1 0 1 0 | 1 0 0 1 0 0 0 0 1 0 0 0 0 1 |
| 219 | 1 1 0 1 1 0 1 1 | 1 0 0 0 1 0 0 0 0 1 0 0 0 1 |
| 220 | 1 1 0 1 1 1 0 0 | 0 1 0 0 0 0 0 0 1 0 0 0 0 1 |
| 221 | 1 1 0 1 1 1 0 1 | 0 0 0 0 1 0 0 0 1 0 0 0 0 1 |
| 222 | 1 1 0 1 1 1 1 0 | 0 0 0 1 0 0 0 0 1 0 0 0 0 1 |
| 223 | 1 1 0 1 1 1 1 1 | 0 0 1 0 0 0 0 0 1 0 0 0 0 1 |

FIG. 4G

| | DATA BITS | CHANNEL BITS |
| --- | --- | --- |
| | d1 d2 d3 d4 d5 d6 d7 d8 | c1 c2 c3 c4 c5 c6 c7 c8 c9 c10 c11 c12 c13 c14 |
| 224 | 1 1 1 0 0 0 0 0 | 0 1 0 0 0 1 0 0 0 0 0 0 1 0 |
| 225 | 1 1 1 0 0 0 0 1 | 0 0 0 0 0 1 0 0 0 0 0 0 1 0 |
| 226 | 1 1 1 0 0 0 1 0 | 1 0 0 0 0 1 0 0 0 1 0 0 1 0 |
| 227 | 1 1 1 0 0 0 1 1 | 0 0 1 0 0 1 0 0 0 0 0 0 1 0 |
| 228 | 1 1 1 0 0 1 0 0 | 0 1 0 0 0 1 0 0 0 1 0 0 1 0 |
| 229 | 1 1 1 0 0 1 0 1 | 0 0 0 0 0 1 0 0 0 1 0 0 1 0 |
| 230 | 1 1 1 0 0 1 1 0 | 0 1 0 0 0 0 0 1 0 0 0 0 1 0 |
| 231 | 1 1 1 0 0 1 1 1 | 0 0 1 0 0 1 0 0 0 1 0 0 1 0 |
| 232 | 1 1 1 0 1 0 0 0 | 1 0 0 0 0 1 0 0 0 0 0 0 1 0 |
| 233 | 1 1 1 0 1 0 0 1 | 1 0 0 0 0 1 0 0 0 0 0 1 0 0 |
| 234 | 1 1 1 0 1 0 1 0 | 0 0 0 0 1 0 0 1 0 0 1 0 0 1 |
| 235 | 1 1 1 0 1 0 1 1 | 0 0 0 0 1 0 0 1 0 0 0 0 1 0 |
| 236 | 1 1 1 0 1 1 0 0 | 0 1 0 0 0 1 0 0 0 0 0 1 0 0 |
| 237 | 1 1 1 0 1 1 0 1 | 0 0 0 0 0 1 0 0 0 0 0 1 0 0 |
| 238 | 1 1 1 0 1 1 1 0 | 0 0 0 1 0 0 0 1 0 0 0 0 1 0 |
| 239 | 1 1 1 0 1 1 1 1 | 0 0 1 0 0 1 0 0 0 0 0 1 0 0 |
| 240 | 1 1 1 1 0 0 0 0 | 0 0 0 0 0 1 0 0 1 0 0 0 1 0 |
| 241 | 1 1 1 1 0 0 0 1 | 1 0 0 0 0 0 1 0 0 1 0 0 1 0 |
| 242 | 1 1 1 1 0 0 1 0 | 1 0 0 1 0 0 1 0 0 1 0 0 1 0 |
| 243 | 1 1 1 1 0 0 1 1 | 0 0 0 0 1 0 0 0 1 0 0 0 1 0 |
| 244 | 1 1 1 1 0 1 0 0 | 0 1 0 0 0 0 1 0 0 1 0 0 1 0 |
| 245 | 1 1 1 1 0 1 0 1 | 0 0 0 0 0 0 1 0 0 1 0 0 1 0 |
| 246 | 1 1 1 1 0 1 1 0 | 0 0 0 1 0 0 1 0 0 1 0 0 1 0 |
| 247 | 1 1 1 1 0 1 1 1 | 0 0 1 0 0 0 1 0 0 1 0 0 1 0 |
| 248 | 1 1 1 1 1 0 0 0 | 0 1 0 0 1 0 0 0 0 1 0 0 1 0 |
| 249 | 1 1 1 1 1 0 0 1 | 1 0 0 0 0 0 0 0 0 1 0 0 1 0 |
| 250 | 1 1 1 1 1 0 1 0 | 1 0 0 1 0 0 0 0 0 1 0 0 1 0 |
| 251 | 1 1 1 1 1 0 1 1 | 1 0 0 0 1 0 0 0 0 1 0 0 1 0 |
| 252 | 1 1 1 1 1 1 0 0 | 0 1 0 0 0 0 0 0 0 1 0 0 1 0 |
| 253 | 1 1 1 1 1 1 0 1 | 0 0 0 0 1 0 0 0 0 1 0 0 1 0 |
| 254 | 1 1 1 1 1 1 1 0 | 0 0 0 1 0 0 0 0 0 1 0 0 1 0 |
| 255 | 1 1 1 1 1 1 1 1 | 0 0 1 0 0 0 0 0 0 1 0 0 1 0 |

FIG. 4H

METHOD OF CONVERTING A SERIES OF M-BIT INFORMATION WORDS INTO A MODULATED SIGNAL

BACKGROUND OF THE INVENTION

1. Field of the Invention

The invention relates to a method of converting a series of m-bit information words to a modulated signal, with m being an integer, in which method an n-bit code word is delivered for each received information word, and the delivered code words alternate with p-bit merging words converted to the modulated signal, and (n+p) exceeding m, and in which the series of information words is converted into a series of alternate code words and merging words according to rules of conversion, so that the corresponding modulated signal satisfies a predetermined criterion. The invention further relates to a method of producing a record carrier on which a signal is recorded obtained according to said method.

The invention further relates to a coding device for performing the method as claimed, this device comprising an m-to-n bit converter for converting the m-bit information words to n-bit code words, and means for selecting the p-bit merging words, and means for converting the alternate n-bit code words and p-bit merging words into a modulated signal.

The invention further relates to a recording device in which a coding device of this type is used.

The invention further relates to a signal.

The invention further relates to a record carrier on which the signal is recorded.

The invention further relates to an apparatus for manufacturing said record carrier, comprising an optical system for scanning a radiation-sensitive layer of a record carrier by a radiation beam and a modulation unit for modulating the radiation beam in such a way that the pattern formed by the radiation beam in the radiation-sensitive layer corresponds to a control signal applied to the modulation unit.

The invention further relates to a decoding device for converting the signal to a series of m-bit information words, this device comprising converting means for converting the signal to a string of bits having a low or high logical value, this bit string containing n-bit code words which correspond to the information signal portions, and this device comprising converting means for converting the series of code words to the series of information words, while a code word-dependent information word is assigned to each of the code words to be converted.

Finally, the invention relates to a reading device in which a decoding device of this type is used.

2. Description of the Related Art

Such methods, such devices, such a record carrier and such a signal is known from the book "Coding Techniques for Digital Recorders" by K. A. Schouhamer Immink, Chapter 5, Prentice-Hall, 1991, ISBN 0-13-140047-9. In said title, for example, encoders are described, which are used for converting a series of m-bit information words into a series of bits wherein the number of "0"s between two consecutive "1"s lies between d and k. These constraints are also referenced d- and k-constraint, or dk-constraint. In specific prior art methods, (see Pages 114–117 of said title) m-bit information words are converted into n-bit code words in accordance with a conversion table, and where p-bit merging words are inserted between consecutive code words, m, n, p being integers, (n+p) exceeds m, and p exceeds or equals d.

The code words and the merging words are chosen such that the dk-constraint of the catenation of alternate code words and merging words is satisfied. The alternate code words and merging words are converted, via a modulo-2 integration operation, into a corresponding signal formed by bit cells having a high or low signal value, a "1"-bit being represented in the modulated signal by a change from the high to the low signal value or vice versa. A "0"-bit is represented by the absence of a change of signal value at a transition between two bit cells. The minimum distance between consecutive transitions of the modulated signal is d+1 bit intervals and the maximum distance between consecutive transitions of the modulated signal is k+1 bit intervals. The dk-constraint is imposed as it is desirable that the system is self-clocking, which requires that consecutive transitions in the modulated signal should not be too far apart, and it is a further requirement that two transitions of the modulated signal should not be following too closely in order to limit inter symbol interference. In addition, the low-frequency components of the modulated signal should be kept as small as possible. Such a signal is also called a dc-free signal. A first reason for using said dc-free signals is that recording channels are not normally responsive to low-frequency components. The suppression of low-frequency components in the signal is also highly advantageous when the signal is read from an optical record carrier on which the signal is recorded in the track, because then continuous tracking control undisturbed by the recorded signal is possible. A good suppression of the low-frequency components leads to improved tracking with less disturbing audible noise.

An example of the use of such signals to record and read an audio signal on an optical or magneto-optical record carrier can be found in U.S. Pat. No. 4,501,000. The specification describes the EFM modulation system, which is used for recording information on Compact Discs (CD) or MiniDisc (MD). The EFM-modulated signal is obtained by converting a series of m(=8)-bit information words into a series of n(=14)-bit code words, and where p(=3) merging bits are inserted between consecutive code words. Respective code words of 14 bits satisfy the conditions that at least d(=2) and at most k(=10) "0"s are placed between two consecutive "1"s. In order to satisfy this condition also between code words, 3-bit merging words are used. Four 3-bit merging words of the 8 possible 3-bit merging words are permitted to be used, namely "001", "010", "000", and "100". The remaining possible 3-bit merging words, namely "111", "011", "101", and "110" are not used as they violate the prescribed d(=2)-constraint. One of the four allowed merging words is selected such that the bit string obtained after cascading alternate code words and merging words satisfies the dk-constraint, and that in the corresponding modulo-2 integrated signal the running digital sum value remains substantially constant. The running digital sum value, RDS, at a specific instant is understood to mean the difference between the number of bit cells having the high signal value and the number of bit cells having the low signal value, calculated over the modulated signal portion situated before this specific instant. A substantially constant running digital sum value means that the frequency spectrum of the signal does not comprise frequency components in the low frequency area. By deciding the merging words according to above rules, low-frequency components of the modulated signal can be reduced. The choice for the 3-bit merging words is based on the requirement that, on the one hand the channel signal is substantially dc-free and that also the dk-constraint for the channel signal is satisfied. Decoding of EFM signals is very simple. The 3-bit merging words are skipped by the decoder, and the 14-bit code words are translated, using a look-up table or PLA etc., into the information bytes.

An improved method for suppressing the low-frequency components is described by K. A. Schouhamer Immink and U. Gross in the article entitled "Optimization of Low-frequency Properties of Eight-to-Fourteen Modulation (EFM)", published in the Radio and Electronic Engineer, vol. 53, pp. 63–66, 1983. In said article the authors describe a method, where the selection of a p-bit merging word does not only depend on a single upcoming code word, but where in contrast the selection is made using q upcoming code words, where q is an integer exceeding 1. From the article cited, it can be concluded that this so-called look-ahead strategy improves the quality of the low-frequency suppression. A significant disadvantage of said strategy is the difficulty of implementing it as the number of operations, such as adding, comparing, buffering, and so on, grows exponentially with the number of code words involved in the selection process. By way of example, a look-ahead strategy using two code words requires 4×4=16 add/compare operations, and a strategy using three code words requires 4×4×4=64 add/compare operations, and so on. For many applications, where speed and power consumption of the selection circuitry is at premium said look-ahead strategy cannot practically be employed.

In a recent article entitled "Weakly constrained codes", published in IEE Electronics Letters, vol. 33, no. 23, pp. 1943–1944, November 1997, the author, K. A. Schouhamer Immink, described a novel type of constrained codes, termed weakly constrained codes. Weakly constrained codes fail to comply with the dk-constraints as they produce sequences that violate the prescribed constraints with (low) probability P. The author argues that if the channel is not free of errors, it is pointless to feed the channel with perfectly constrained sequences. Violation of prescribed dk-constraints offers an additional degree of freedom that can be exploited to reduce the low-frequency components. It is known that violations of the d-constraint, i.e., runs of "0"s smaller than d, are prone to error resulting from inter symbol interference. A violation of the k-constraint could easily result in loss of clock synchronization, which, in turn, could lead to a burst of errors The method is therefore not very effective as the frequency of violations of the dk-constraint must be small as they will inevitably lead to bit detection errors at the receiver's site Information recording has a constant need for increasing the reading and writing speed. The aim of increased reading speed, however, requires higher servo bandwidth of the tracking mechanism, which, in turn, sets more severe restrictions on the suppression of the low-frequency components in the recorded signal. Improved suppression of the low-frequency components is also advantageous for suppressing audible noise arising from the tracking mechanism. For this reason, it is desirable to make as many efforts to prevent the signal from containing low-frequency components.

SUMMARY OF THE INVENTION

It is, therefore, an object of the invention to provide a digital modulation method, which is capable of suppressing the low-frequency components with high efficiency, while achieving this goal with a small computational load such as add/compare operations.

A further object of the invention is to provide an information-recording medium such as an optical or magneto-optical disc on which digital data modulated by the invention process is recorded.

A possible solution to the problems inherent in the prior art is based on the observation that prior art methods are overly restrictive in the choice of the merging words as only those merging words are allowed that when alternate merging words and code words are cascaded the prescribed dk-constraint is satisfied.

In a first aspect of the present invention there is provided a digital modulation method for converting m-bit information words into n-bit code words, and where p-bit merging words are inserted between consecutive code words, m, n, p being integers, where (n+p) exceeds m. The code words obey both d- and k-constraint in force, but the merging words are not required to obey said d-constraint. It is known that runs of "0"s smaller than d are prone to error resulting from inter symbol interference. However, as the merging words do not provide information to the receiver, the d-constraint in the merging words can be violated without compromising the reliability of the received code words. Then, as a result of the increase of the size of the set of merging words from which can be selected, the low-frequency components of the modulated signal can significantly be reduced with respect to modulated signals generated under the rules of prior art methods or apparatuses. This embodiment is advantageous in that the presence of low-frequency components in the modulated signal can be significantly better avoided than in the prior art.

A further embodiment of the invention is characterized in that synchronization (sync) words are inserted into the series of code words, the sync words showing bit patterns that cannot occur in the bit stream formed by the catenation of the alternate merging words and code words. The selection circuitry excludes those p-bit merging words that when catenated with the alternate code words would generate the sync pattern. The above excluding rule treats the p-bit merging words that contain u "0"s between consecutive "1"s, where u is an integer less than d, as the all "0"s word. This embodiment is advantageous in that in the case the reading mechanism might detect the short "0" runlength as the all "0"s word, false sync patterns are not generated.

These and other objects, features, and advantages of this invention will become more fully apparent from the ensuing description of preferred embodiments of this invention, wherein

DETAILED DESCRIPTION OF THE INVENTION

In the preferred embodiment of the invention, consecutive n-bit code words are alternated with p-bit merging words. In a first aspect of the invention, the encoder generates a set of allowed p-bit merging words for use between consecutive code words so that the sequence comprised of alternate code words and merging words satisfies the conditions that between the leading "1" in the merging word and the trailing "1" in the code word preceding the merging word, and the trailing "1" in the merging word and the leading "1" in the code word following the merging word are at least d "0"s. In a second aspect of the invention, the encoder selects from said set of allowed merging words that merging word that yields the cumulative dc imbalance nearest zero in the catenation of the code word and that merging word after modulo-2 integration. For example, in the EFM code, where d=2, k=10, n=14, m=8, and p=3, there are four 3-bit merging words of the 8 possible merging words allowed, namely "001", "010", "000", and "100". In an embodiment of the invention, by way of example, the remaining 3-bit merging words, namely "111", "011", "101", and "110" are allowed to be used. There are, however, three restrictions: firstly, in the cascade of alternate 14-bit code words and 3-bit merging words the k(=10) constraint should not be violated, and secondly in the cascade of alternate 14-bit code words and 3-bit merging words the sync pattern may not be generated, and thirdly, in order to safeguard the reliability of the code words, the number of consecutive "0"s at the beginning or end of the two code words joining the merging word should be at least d(=2). TABLE 1 shows schematically the process of generating the set of allowed merging words, the computation of the corresponding RDS, and the selection of the merging word that yields the least dc-imbalance.

TABLE 1

| 14-bit word | Merging bits | Next 14-bit word | RDS |
| --- | --- | --- | --- |
| 01001000100100 | 000 | 00100000000100 | 4 |
| 01001000100100 | 001 | 00100000000100 | 10 |
| 01001000100100 | 010 | 00100000000100 | 8 |
| 01001000100100 | 011 | 00100000000100 | 2 |
| 01001000100100 | 100 | 00100000000100 | 6 |
| 01001000100100 | 101 | 00100000000100 | 0 |
| 01001000100100 | 110 | 00100000000100 | 2 |
| 01001000100100 | 111 | 00100000000100 | 8 |

TABLE 1 shows in detail the translation of the 8-bit information word "01000000", in decimal 64, followed by the translation of the 8-bit information word "01011111", in decimal 95. According to the translation table shown in FIGS. 4A–4H, the information words are translated into the 14-bit code words "01001000100100" and "00100000000100", respectively. For illustrative purposes it is assumed that the RDS at the end of the code word "01001000100100" equals +5. For the specific case in hand all possible 3-bit merging words can be used without violating the prescribed constraints. TABLE 1 shows all possible 3-bit merging words, and it shows the resulting RDS after the merging word and code word have been catenated and integrated modulo-2. According to the invention, the encoder selects that particular merging word resulting in an RDS nearest zero, i.e. it selects "101". The RDS after cascading the merging words "101" and the code word "00100000000100" is thus 0. In this manner the dc level of the modulated signal is maintained at a substantially constant level and the frequency spectrum of the modulated signal will show suppressed low-frequency components. Note that prior art encoders, where the merging bits obey the prescribed (d)-constraint, will select the merging word "000", which will lead to a larger RDS, namely +4. This example shows that signals obtained in accordance with the invented method show a more constant dc level of the modulated signal than those generated by prior art methods.

TABLE 2

| 14-bit word | Merging bits | Next word | RDS |
| --- | --- | --- | --- |
| 01001000100100 | 000 | 01000001001001 | 4 |
| 01001000100100 | 001 | 01000001001001 | Not allowed |
| 01001000100100 | 010 | 01000001001001 | 8 |
| 01001000100100 | 011 | 01000001001001 | Not allowed |
| 01001000100100 | 100 | 01000001001001 | 6 |
| 01001000100100 | 101 | 01000001001001 | Not allowed |
| 01001000100100 | 110 | 01000001001001 | 2 |
| 01001000100100 | 111 | 01000001001001 | Not allowed |

As a further illustration of the invention, TABLE 2 shows the process of generating all 3-bit merging words in the case code words "01001000100100" and "01000001001001" are catenated. Merging words "001", "011", "101", and "111" are not allowed as the trailing "1" of the merging word and the leading "1" of the code word "01000001001001" are less than d(=2) "0"s apart. If it is assumed that the RDS at the end of the code word "001000100100" equals +5, then the RDS after a candidate merging word and the 14-bit code word have been catenated and integrated modulo-2 is listed in TABLE 2. According to an aspect of the invention, the encoder selects the merging word resulting in the RDS nearest zero, i.e. it selects "110". The RDS after cascading the merging words "110" and the code word "01000001001001" is thus +2. Note that a prior art encoder, where the merging words obey the prescribed (d)-constraint, will select the merging word "000", which will lead to a larger RDS, namely +4.

In the foregoing an explanation was given of an encoder that comprises means for generating all possible p-bit merging words. The encoder further comprises means for selecting that p-bit merging word that satisfies the given constraints and achieves the minimum absolute value of the RDS. It will be obvious for a person skilled in the art that there could be p-bit merging words within the set of possible words that will always lead to the same value of RDS of the catenation of p-bit merging word and n-bit code word. This property can be advantageously be exploited to decrease the selection set, and thus the computational load and/or hardware requirements of the selection circuitry. It can easily be verified that, for example, when p=3 the merging words "111" and "010" will always lead to the same value of the RDS. One of the words, for example "111" can be excluded from the selection set, so that the size of the selection is reduced from 8 to 7 words. It will also be obvious to a person skilled in the art that the p-bit merging bits can be selected on the basis of other criteria than the RDS described in the foregoing.

Preferably, the encoded signal comprises a sequence of q alternate merging words and code words, where q is an integer. Between encoded signal portions are inserted synchronization (sync) signals. Preferably, the sync signal cannot occur in a sequence of the encoded signal. Conventionally, the sync pattern contains a series of s bits having a logical "0", where s is an integer exceeding k, or alternatively the sync pattern consists of two series of k bits having a logical "0" separated by a bit having a logical "1". The p-bit merging word is selected from the candidate merging words such that a catenation of alternate merging words and code words does not contain a pattern equal to the sync pattern. The information is stored in a succession of spaced marks, the lengths of both the marks and the spaces between successive marks being discretely variable in accordance with a succession of code words. It should be appreciated that the merging words "111", "1011", "101 ", and "110" will generate marks or spaces whose length is short with respect to the size of the reading spot. The lengths of the spaces and marks can be so short that the pick up unit cannot observe them. This means that the merging words "111", "011", "101", and "110" will be detected by the decoding device as "000", which in turn means that the detection circuitry could detect false sync patterns or it might lead to a violation of the k constraint. In a preferred embodiment, the merging word selection circuitry can avoid the generation of false sync patterns and/or false k-constraint violation by treating the merging words "111", "011", "101", and "110" as "000" in the computation of the sync pattern or k-constraint. For example, if k=10 then the selection circuitry will exclude merging words that generate sequences such as '00001100000' or '00010100000' and so on as they might lead to false k(=10)-constraint violations. If the sync pattern is '10000000000100000000001' then the selection circuitry will exclude merging words that generate sequences such as '10011000000100000000001 ' or '10000000000100010100001' and so on that might lead to the generation of a false sync pattern.

An embodiment of the invention is described below referring to the diagrams.

Figure 1:
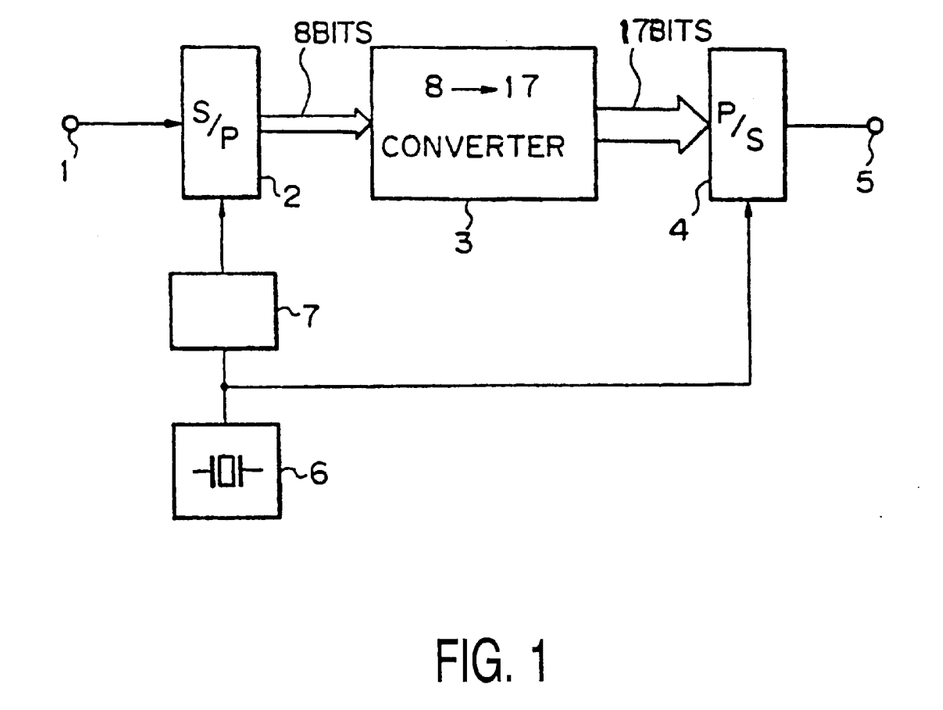
FIG. 1 is a simplified block diagram of an embodiment of the invention.

In FIG. 1, reference numeral 1 denotes an input terminal which is supplied with digital data to be recorded on a recording medium such as an optical or magneto-optical disc, numeral 2 refers to a serial-parallel converter for converting input data into data of m parallel bits, and numeral 3 denotes a data converter. The data converter 3 is fed with data bits d1, ..., d8 and converts the data bits into 17 channel bits c1, ..., c17. The 17-bit word consists of two parts, namely a 14-bit code word with channel bits c1, ..., c14, and a 3-bit merging word with channel bits c15, ..., c17. The 14-bit word is generated with a data converter which is made of ROM, PLA, and so on. The data converter translates the data bits d1, ..., d8 into output channel bits c1, ..., c14 in the form of 14 bits. The code conversion tables shown in FIGS. 4A to 4H comply with the rule that the n(=14) code bits (c1 to c14) obtained by such modulator never fails to place at least k(=2) and at most d(=10) "0"s between consecutive "1"s. Clock generator 6 generates a clocking signal for the circuitry. The data converter 3 has additional means to generate the 3-bit word, c15, . . . c17. The additional means can either consist of ROM, PLA and so on or it can be built using a computer that has been programmed to determine the 3-bit word such that particular specifications described above are satisfied.

Figure 2:
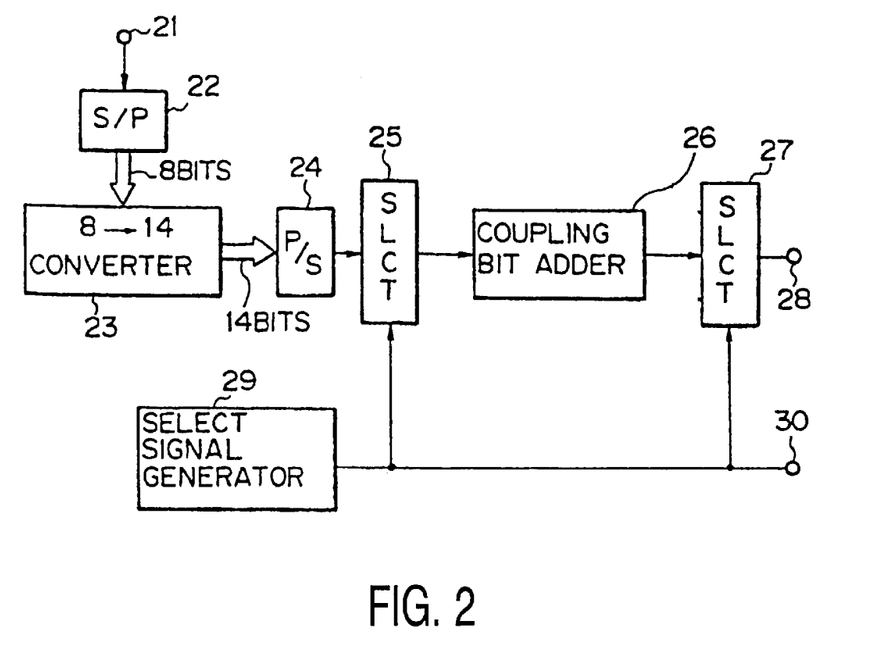
FIG. 2 is a schematic view for use in explanation of modulated data.

FIG. 2 shows an embodiment for a coding device according to the invention by which the method described above can be carried out. In FIG. 2 reference numeral 21 refers to an input terminal supplied with the signal data to be translated prior to be recorded on a recording medium, numeral 22 refers to a serial-to-parallel converter for converting input data into data of 8 parallel bits, and numeral 23 denotes a data converter. The data converter 23, which consists of ROM, PLA and others, is supplied with data bits d1, ..., d8 in the form of 8 bits, and supplies the code word c1, c2, ..., c14 in the form of 14 bits. Conversion tables can be found in FIGS. 4A to 4H, which are the same as the formerly proposed EFM modulation. The 14-bit data is converted from a parallel into a serial converter using converter 24. Selection circuit 25 selects the 14 bit serially converted data which shall be catenated with the three bit merging word. The coupling bit adder, 26, generates the various candidate merging words that satisfy the prescribed dk-constraint. The set of candidate merging words is preferably stored in ROM, PLA and others. The selection circuit, 27, selects from the candidates the one with the RDS nearest zero. The selection circuit 27 comprises an arithmetic unit for computing the RDS of each possible candidate merging word catenated by the 14-bit code word. The signal generator 29 generates signals for timing control for the selection circuitry 27. The modulated signal obtained after modulo-2 integration of the catenation of alternate merging words and code words, taken out from terminals 29 and 30, is forwarded to an optical pickup or other recording means via a recording amplifier and recorded onto an optical carrier, not shown, such as optical or magneto-optical disc or tape or other recording medium.

Figure 3:
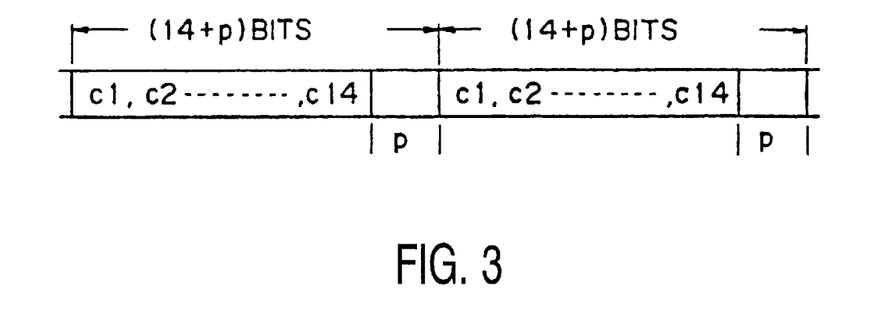
FIG. 3 is a diagram for use in explanation of the catenation of consecutive code words and the p-bit merging words.
Figure 4A:
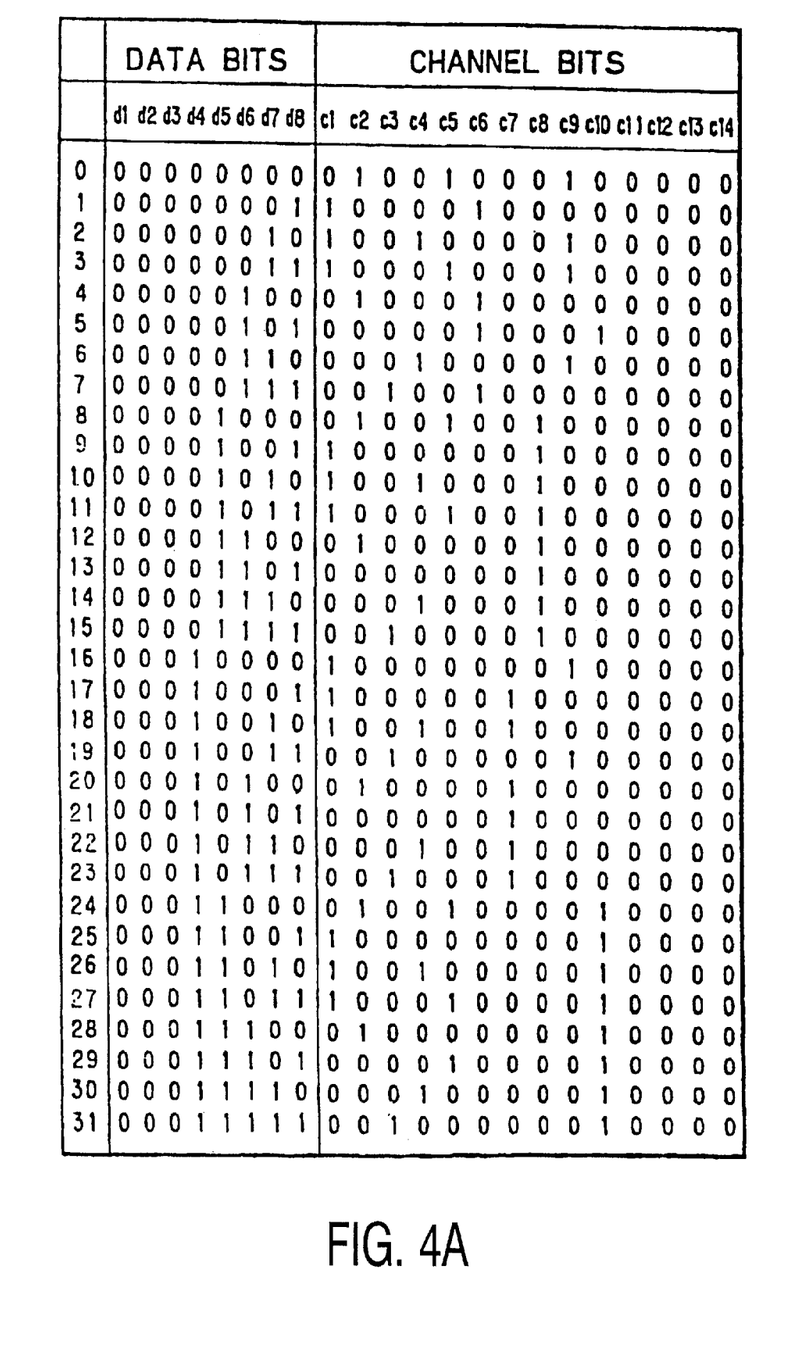
FIGS. 4A to 4H are schematic views showing conversion tables for conversion of 8-bit information words into 14-bit code words and vice versa.
Figure 4B:
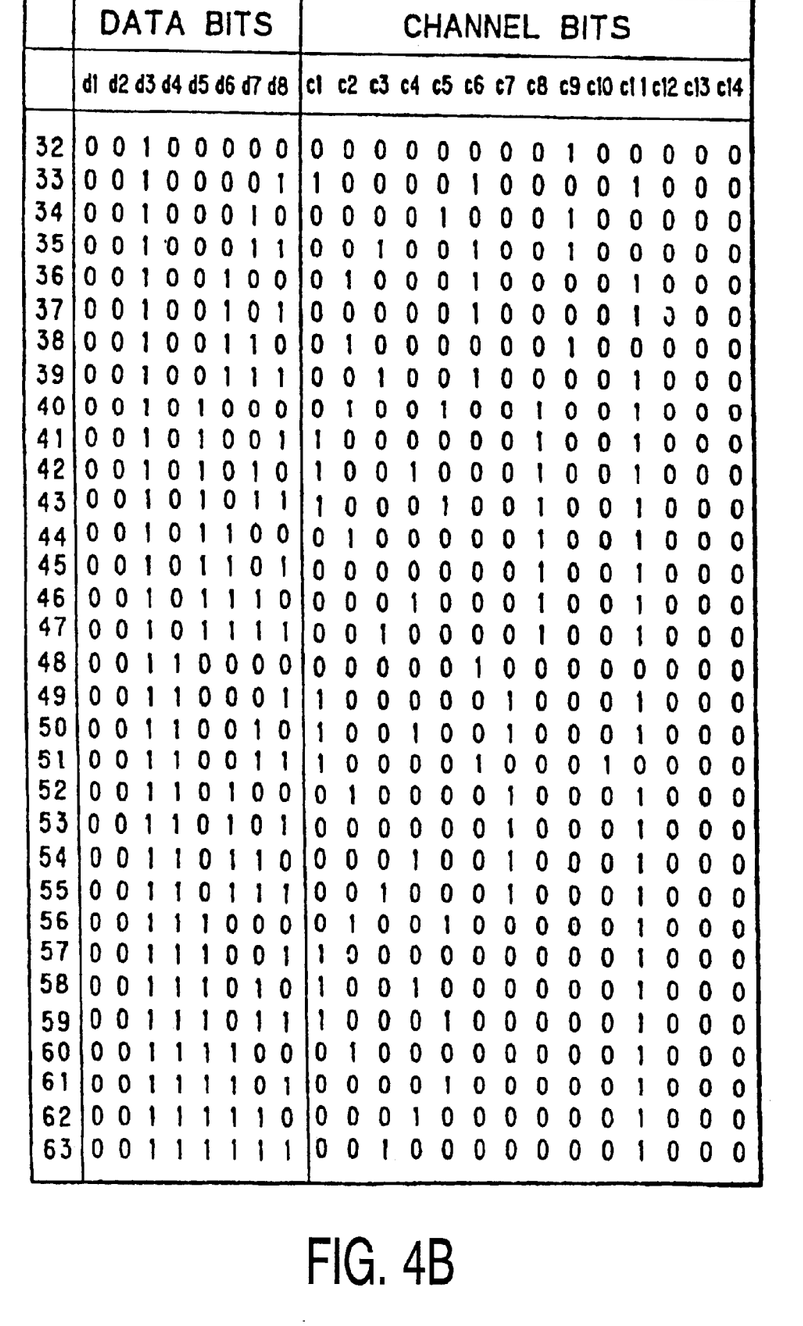
Figure 4C:
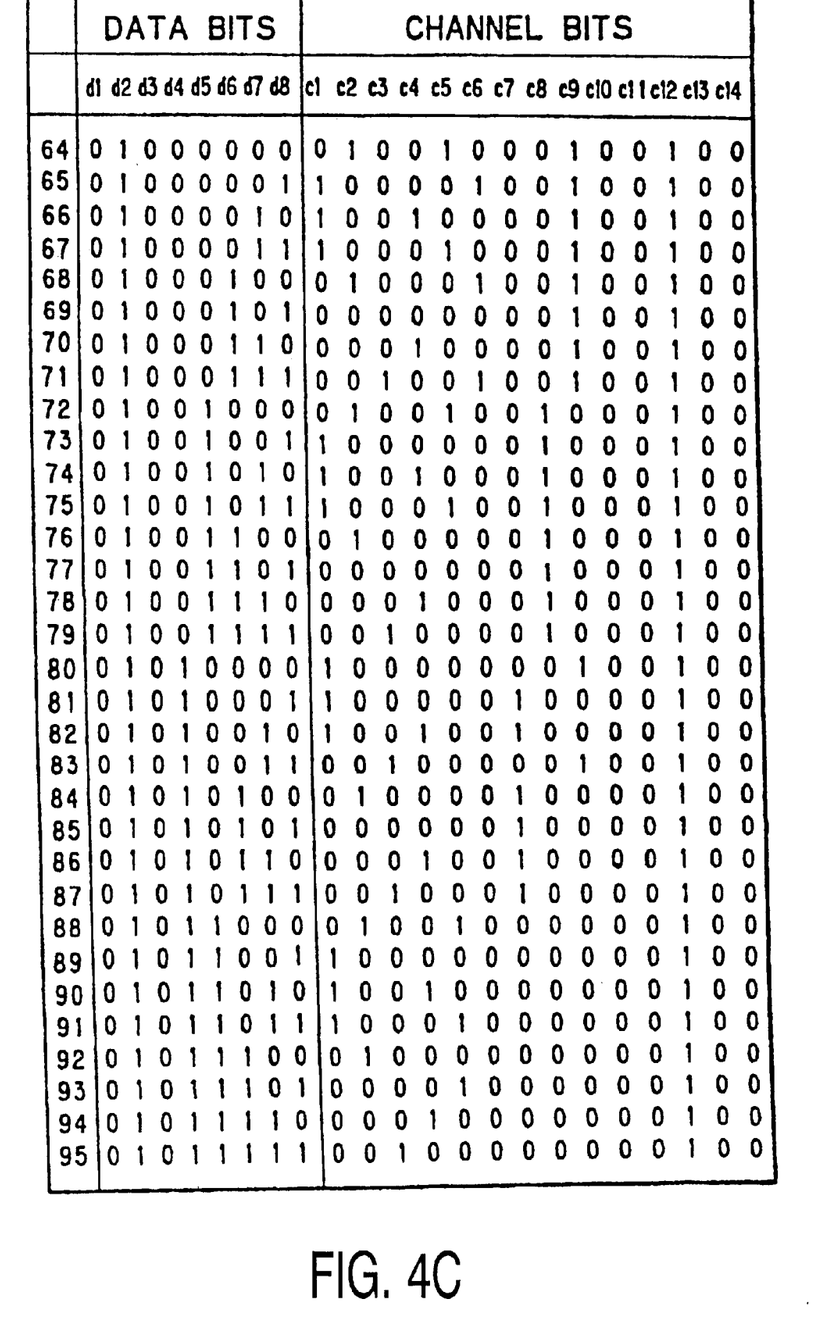
Figure 4D:
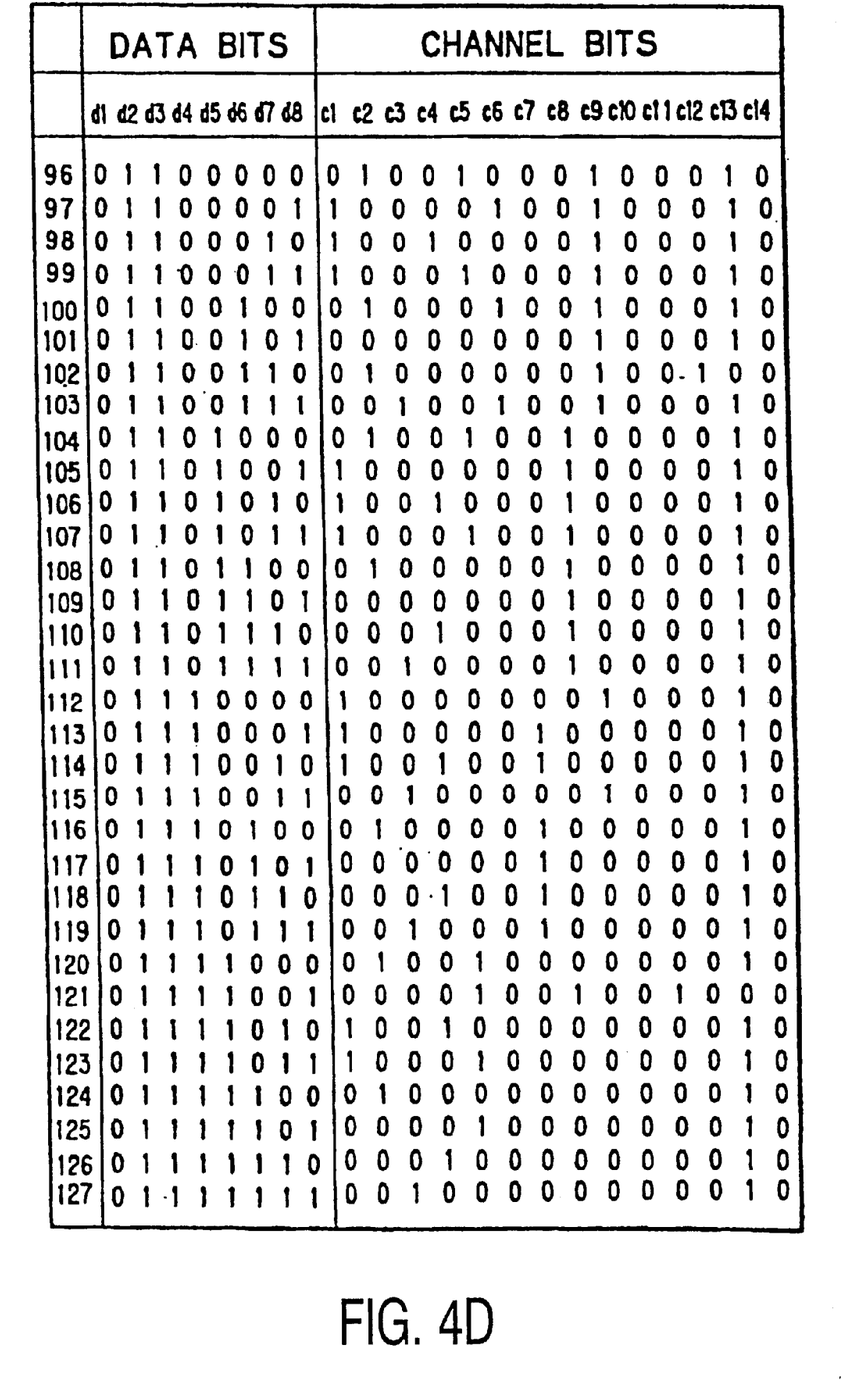
Figure 4E:
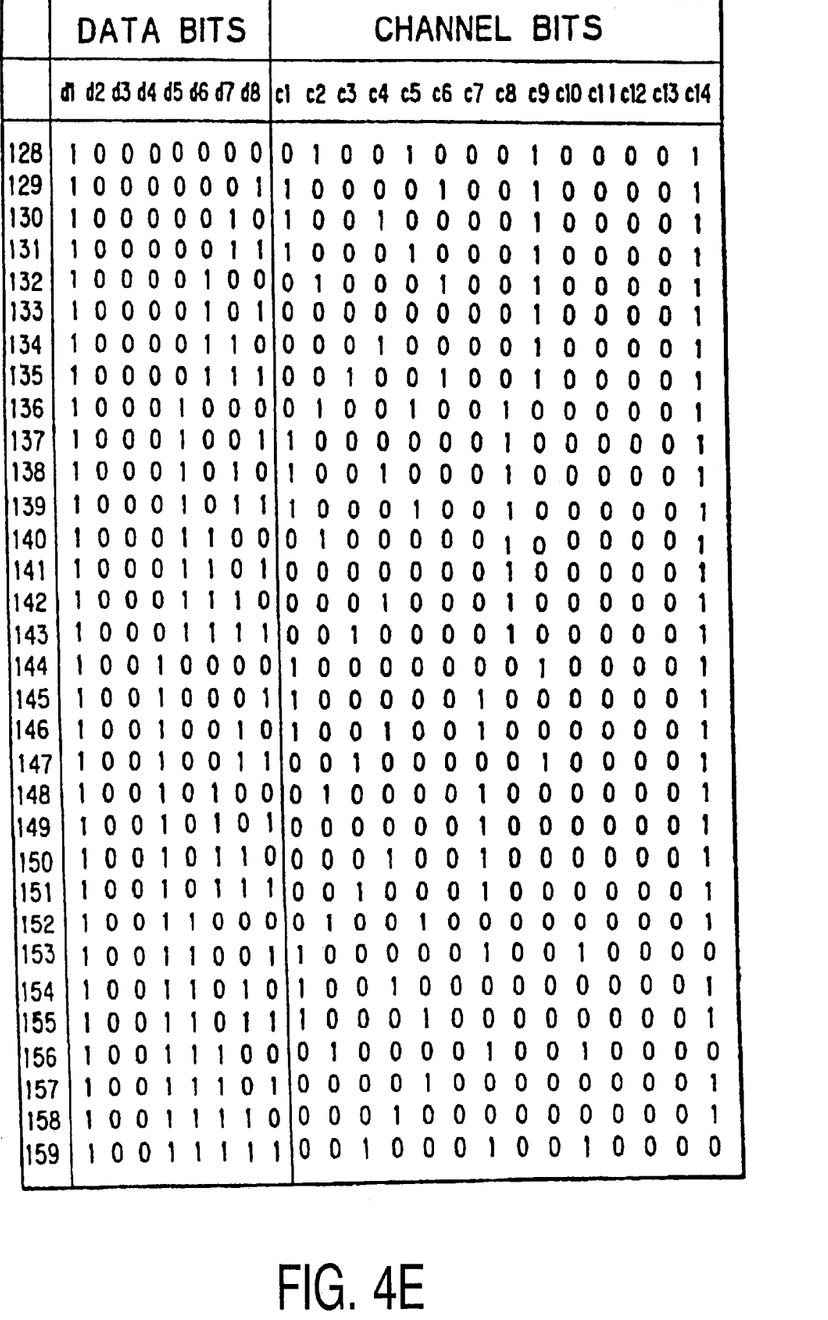
Figure 4F:
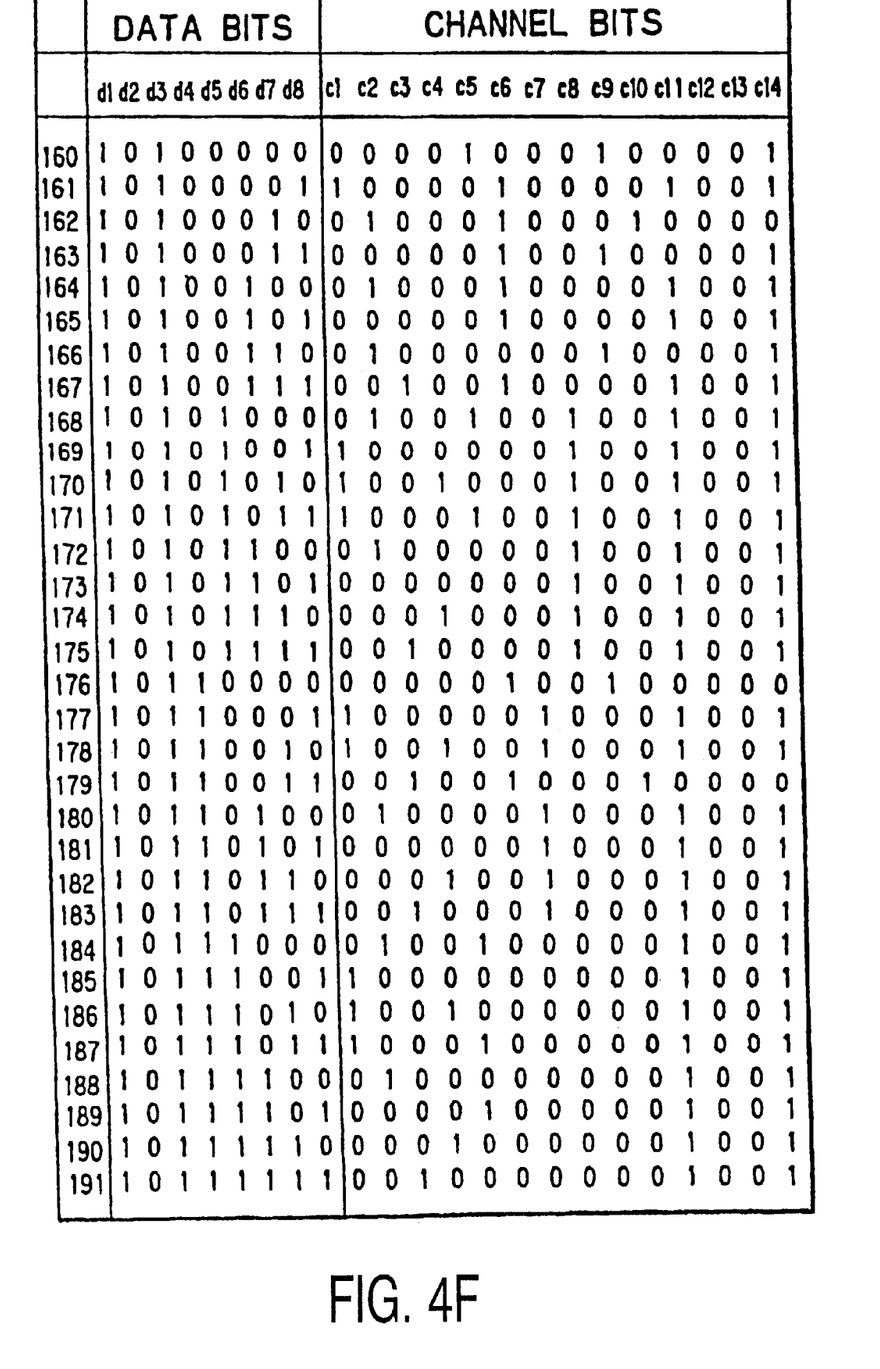
Figure 4G:
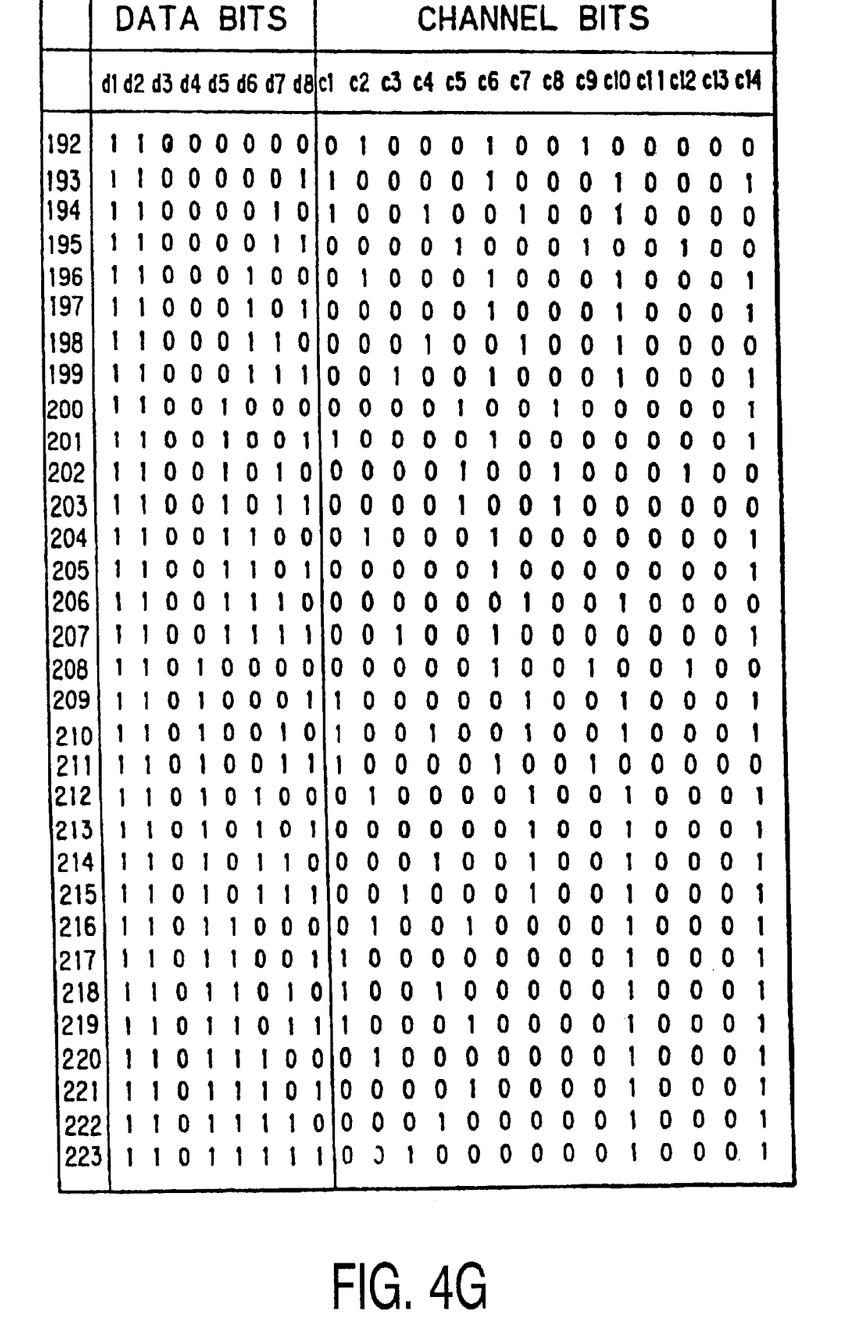
Figure 4H:
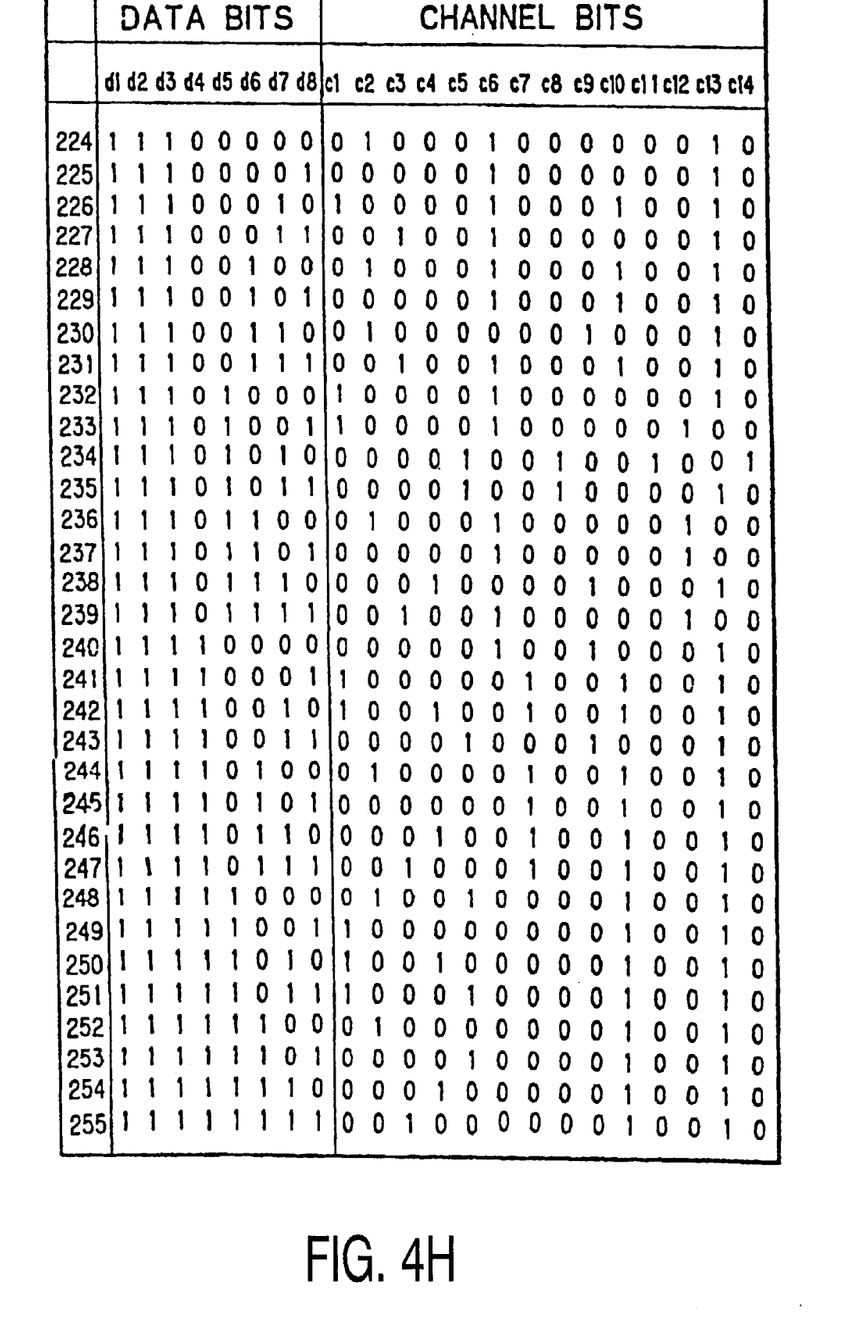

FIG. 3 shows the catenation of two m(=14)-bit code words and the p-bit merging words. In the preferred embodiment the value of p is 3 or 2.

FIGS. 4A–H shows the preferred conversion tables for translating the 8-bit data words, d1, . . . , d8, into the 14-bit code word c1, . . . , c14. The conversion tables comply with the rule that there are always at least two and at most ten "0"s between consecutive "1"s. It will be understood that code conversion tables different from those shown in FIGS. 4A–H can be used.

It will be appreciated from the foregoing description that the present invention provides an improved system for recording and playing back digital information on a disc-shaped record. The information is stored in a succession of spaced marks, the lengths of both the marks and the spaces between successive marks being discretely variable in accordance with a succession of code words. The digital information is thereby stored with an improved suppression of the low-frequency components of the recording signal.

Although the present invention has been described in detail with reference to its presently preferred embodiment, it will be understood by those of ordinary skill in the art that various modifications can be made without departing from the spirit and scope of the invention. Accordingly, it is not intended that the invention be limited, except as by the appended claims. Any reference signs do not limit the scope of the claims. The word "comprising" does not exclude the presence of other elements or steps than those listed in a claim. Use of the word "a" or "an" preceding an element does not exclude the presence of a plurality of such elements.

What is claimed is:

1. A method of coding a sequence of binary data bits into a sequence of binary channel bits, comprising the steps of:
   (a) coding into sequential n-bit code words a plurality of consecutive and sequential blocks of m data bits in accordance with a translation table, wherein m is an integer, and n is an integer exceeding m, wherein the n-bit code words satisfy a dk-constraint such that consecutive "1"s are separated by at least d and at most k "0"s, and
   (b) inserting a p-bit merging word between said n-bit code words so as to cause a catenation between the n-bit code words and the merging word, wherein p is an integer,
   wherein the catenation of said n-bit code words and merging words satisfies the condition that between a leading "1" in the merging word and a trailing "1" in the n-bit code word preceding the merging word are at least d quantity of "0"s, and that between a trailing "1" in the merging word and a leading "1" in an n-bit code word following the merging word are at least d quantity of "0"s, wherein the merging words are not required to satisfy said d constraint as do the n-it code words.

2. An information recording medium having recorded thereon an information structure formed in response to the method of coding as claimed in claim 1, inclusive.

3. An information recording medium according to claim 2, wherein said information medium comprises an optically readable record carrier.

4. A method as claimed in claim 1, wherein p-bit merging words are operative or constraining the number of "0"s between consecutive "1"s of the catenation of the alternate code words and merging words to at maximum s, where s an integer equal to or exceeding k.

5. A method as claimed in claim 1, wherein p-bit merging words are operative for diminishing the cumulative dc imbalance of the signal generated after modulo-2 integration of the catenation of the alternate code words and merging words.

6. A method of encoding a binary digital signal according to claim 1, wherein d=2, k=10, m=8, n=14, and p=3.

7. A method of encoding a binary digital signal according to claim 1, wherein d=2, k=10, m=8, n=14, and p=2.

8. A decoder for decoding an encoded signal in accordance with the method claimed in claim 1.

9. A coding device for carrying out the method of coding a sequence of binary data bits into a sequence of binary channel bits as claimed in claim 1, inclusive.

* * * * *